United States Patent
Uchiyama (10) Patent No.: US 7,307,324 B2
(45) Date of Patent: Dec. 11, 2007

(54) MOS TRANSISTOR IN AN ACTIVE REGION

(75) Inventor: Hiroyuki Uchiyama, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 120 days.

(21) Appl. No.: 11/249,400

(22) Filed: Oct. 14, 2005

(65) Prior Publication Data
US 2006/0091454 A1 May 4, 2006

(30) Foreign Application Priority Data
Oct. 22, 2004 (JP) ............................. 2004-307944

(51) Int. Cl.
*H01L 29/76* (2006.01)
*H01L 29/94* (2006.01)
*H01L 31/00* (2006.01)
(52) U.S. Cl. ...................... 257/397; 257/395; 257/396; 257/E21.54
(58) Field of Classification Search ................ 257/395, 257/396, 397, E21.54
See application file for complete search history.

(56) References Cited

U.S. PATENT DOCUMENTS

2006/0220110 A1* 10/2006 Lai et al. .................... 257/330

2007/0007563 A1* 1/2007 Mouli ......................... 257/292

FOREIGN PATENT DOCUMENTS

| JP | 2002-43544 A | 2/2002 |
| JP | 2002-110930 A | 4/2002 |

\* cited by examiner

*Primary Examiner*—Ngân V. Ngô
(74) *Attorney, Agent, or Firm*—McDermott Will & Emery LLP (57) ABSTRACT

After an isolation region is formed using a field-forming silicon nitride film, this silicon nitride film is patterned, thereby a gate trench is formed. Next, a gate electrode material is buried into the gate trench, and this is etched back. Thereafter, the silicon nitride is removed, thereby a contact hole is formed. A contact plug is buried into this contact hole. With this arrangement, the contact plug can be formed without using a diffusion layer contact pattern. At the same time, the periphery of the contact plug substantially coincides with a boundary between the element isolation region and the active region. Accordingly, the active region can be reduced.

6 Claims, 14 Drawing Sheets

MOS TRANSISTOR IN AN ACTIVE REGION

TECHNICAL FIELD

The present invention relates to a semiconductor device, and more particularly relates to a semiconductor device having a MOS transistor formed on an active region. The invention also relates to a method of manufacturing a semiconductor device, and more particularly relates to a method of forming a MOS transistor in an active region.

BACKGROUND OF THE INVENTION

Conventionally, the following method of manufacturing a MOS transistor on a semiconductor substrate is generally used. First, an isolation region is formed on the semiconductor substrate using a field-forming insulation film as a mask. The field-forming insulation film is then detached to expose the active region, and a conductive film is deposited on the exposed region. The conductive film is patterned to form a gate electrode. A sidewall is formed on a side surface of the gate electrode, and a contact plug to be connected to a source/drain diffusion region is formed, thereby completing the MOS transistor.

However, according to the conventional method, three mask patterns are necessary including a mask pattern to form a field-forming insulation film (an active field pattern), a mask pattern to form a gate electrode (a gate electrode pattern), and a mask pattern to form a contact plug (a diffusion contact pattern). A part of these three mask patterns cannot be omitted. Therefore, manufacturing cost cannot be reduced by reducing steps of manufacturing process. Furthermore, a positional mismatch between the contact plug and the active region needs to be considered at the time of forming the contact plug using the mask pattern (the diffusion layer contact pattern). Consequently, a wide active region needs to be secured by taking into account a margin for forming the contact plug, and it is difficult to reduce the area of the active region.

Furthermore, in order to form a lightly doped drain (LDD) region and a self-aligned contact, a cap insulation film is necessary on the gate electrode. In this case, a total film thickness of films including the gate electrode becomes about two times the thickness of the gate electrode, which results in a very high aspect ratio. Consequently, a processing margin becomes short in patterning the gate electrode. A margin of burying various kinds of materials in a space between gate electrodes such as a sidewall and a contact plug, and a processing margin of an interlayer insulation film that is once buried into a space between the gate electrodes and then removed become short. This problem is particularly evident in a transistor having a large film thickness of a gate electrode and a very small distance between the gate electrodes due to the employment of a polymetal structure such as a memory cell transistor of a dynamic random access memory (DRAM).

The problem of the very high aspect ratio can be solved somewhat by using a damascene process in the manufacturing of a memory cell of the DRAM, as described in Japanese patent application laid open No. 2002-43544 and Japanese patent application laid open No. 2002-110930. According to the damascene process, an inter-gate insulation film is formed before the gate electrode. Therefore, a defect due to a shortage in a covering rate of the inter-gate insulation film (a short-circuiting between contacts) can be prevented. However, in this case, it is difficult to substantially reduce steps of the photolithography process or substantially reduce the active region.

SUMMARY OF THE INVENTION

The present invention has been achieved to solve the above problems. It is an object of the invention to provide a semiconductor device and a manufacturing method thereof that can reduce steps of a photolithography process.

It is another object of the present invention to provide a semiconductor device and a manufacturing method thereof that can increase an integration degree by reducing an active region.

It is still another object of the present invention to provide a semiconductor device and a manufacturing method thereof that can facilitate forming of gate electrode materials and various kinds of materials to be formed between gate electrodes.

The above and other objects of the present invention can be accomplished by a semiconductor device, comprising: an active region that is surrounded by an isolation region having a source/drain diffusion region and a channel region; a gate electrode provided on the channel region; and a contact plug connected to the source/drain diffusion region, wherein a periphery of the contact plug at the isolation region side substantially coincides with a boundary between the isolation region and the active region.

According to the present invention, the active region is not substantially present at the outside of the periphery of a contact plug. Therefore, a semiconductor device can be highly integrated by reducing the area of the active region.

The above and other objects of the present invention can be also accomplished by a method of manufacturing a semiconductor device, comprising: a first step for forming a field-forming insulation film having a predetermined pattern on a semiconductor substrate; a second step for forming an isolation region using the field-forming insulation film; a third step for forming a gate trench by patterning at least the field-forming insulation film; a fourth step for burying at least a gate electrode into the gate trench; a fifth step for forming a contact hole by removing the field-forming insulation film; and a sixth step for burying a contact plug into the contact hole.

According to this aspect of the present invention, the gate electrode and the contact plug are formed using the field-forming insulation film. Therefore, a contact plug can be formed in the active region in self-alignment. Consequently, the contact plug can be formed without using a mask pattern (a diffusion contact pattern), and steps of the photolithography process can be reduced. Because the aspect ratio of the gate trench and the contact hole can be restricted, various kinds of materials constituting a gate electrode and various kinds of materials constituting a contact plug can be buried easily.

The second step preferably includes a first sub-step for forming an isolation trench on the semiconductor substrate using the field-forming insulation film as a mask and a second sub-step for burying a dielectric material into the isolation trench. With the above arrangement, an element isolation region becomes an STI structure. Therefore, a high flatness can be achieved, and a gate trench can be easily formed, accordingly.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained with reference to the accompanying drawings, using a DRAM as an example.

A surface of the DRAM is divided into a "memory cell region" where a lot of memory cells are disposed and a "peripheral circuit region" where peripheral circuits such as a decoder circuit are disposed. According to this embodiment, a transistor in the memory cell region (a memory cell transistor) and a transistor in the peripheral circuit region are formed simultaneously using the same method. Therefore, in each of the following cross-sectional diagrams (such as FIG. 1) used for the explanation, a partial cross section of a memory cell region M is shown on the left side, and a partial cross section of a peripheral circuit region P is shown on the right side.

Figure 1:
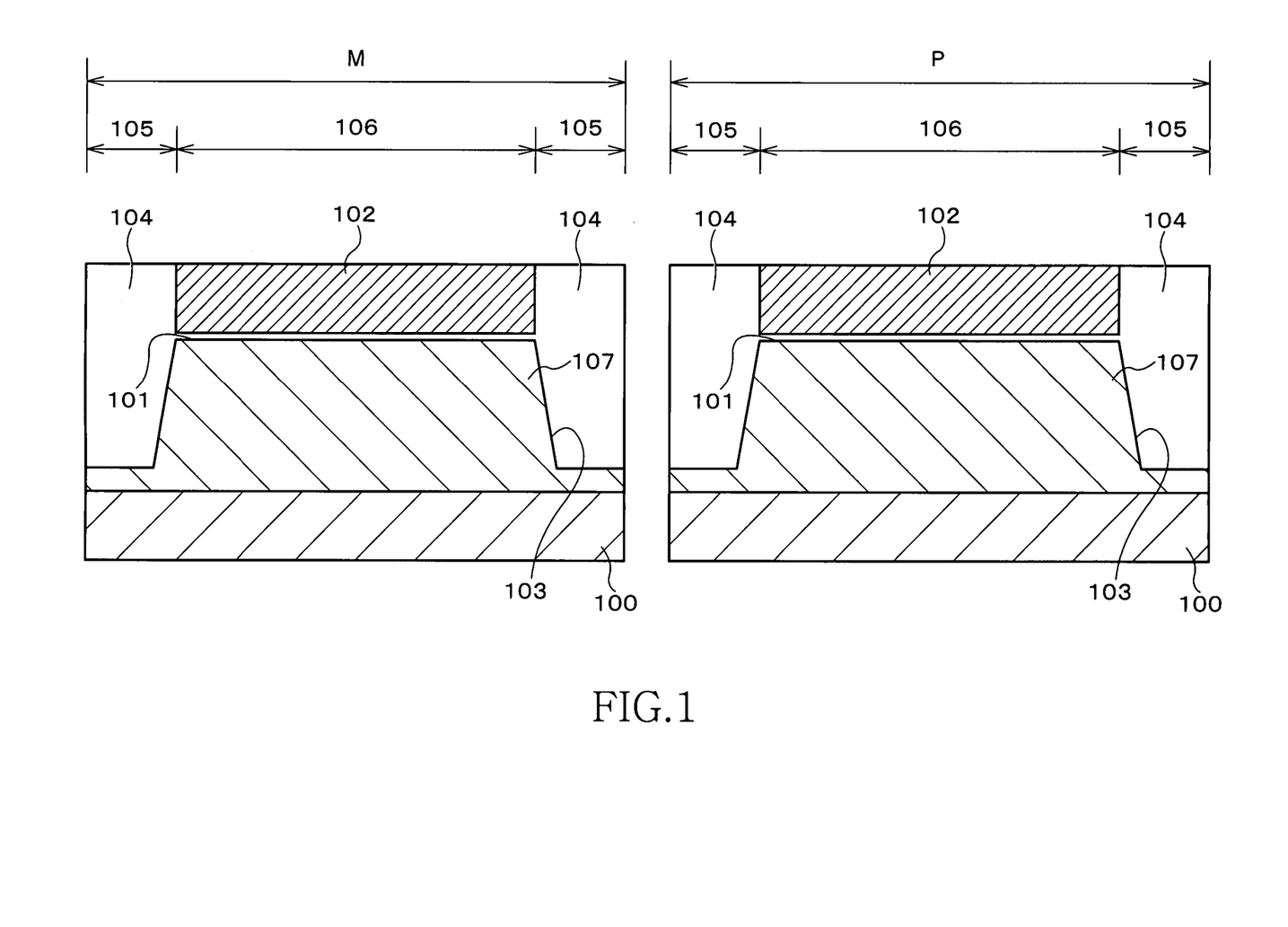
FIG. 1 is a partial cross-sectional diagram showing one process (a formation of a silicon oxide film 101 to a formation of a p-type well region 107) of a method of manufacturing a semiconductor device according to a preferred embodiment of the present invention.

First, as shown in FIG. 1, a silicon oxide film 101 is formed on the surface of a semiconductor substrate 100 by thermal oxidation. Then, a silicon nitride film 102 is formed on the silicon oxide film 101 by chemical vapor deposition (CVD). The silicon nitride film 102 excluding a part of the film that becomes an active region is then removed. Accordingly, only the part of the surface of the semiconductor substrate 100 that becomes the active region is covered with the silicon nitride film 102. The silicon nitride film 102 patterned in this way is used as a "field-forming insulation film" that forms an isolation region.

Next, the silicon oxide film 101 and the semiconductor substrate 100 are etched using the silicon nitride film 102 that works as the field-forming insulation film as a mask, thereby forming an element isolation trench 103 having a depth of about 350 nm. The semiconductor substrate 100 is then thermally oxidized at about 1,000° C., thereby forming a thin silicon oxide (not shown) having a film thickness of about 10 nm on the inner wall of the isolation trench 103. A silicon oxide film 104 is then deposited in the film thickness of 450 to 500 nm by CVD. Accordingly, the isolation trench 103 is filled by the silicon oxide film 104. The silicon oxide film 104 is polished by chemical mechanical polishing (CMP) until when the upper surface of the silicon nitride film 102 is exposed, and both upper surfaces are flattened, thereby completing an isolation region 105. The isolation region 105 having a trench structure like this is generally called a shallow trench isolation (STI) region. The region of the semiconductor substrate 100 surrounded with the isolation region 105 becomes an active region 106.

Next, impurity such as boron (B) is ion-implanted into the active region 106 via the silicon nitride film 102, thereby forming a p-type well region 107 in the active region 106. When a circuit in a CMOS structure is to be formed in the peripheral circuit region P, impurity such as phosphor (P) and arsenic (As) is ion-implanted in a state that the region in which an N-type MOS transistor is to be formed is masked, thereby forming an n-type well region (a deep n well region). Impurity such as boron (B) is then ion-implanted without using a mask, thereby forming a p-type well region 107.

Figure 2:
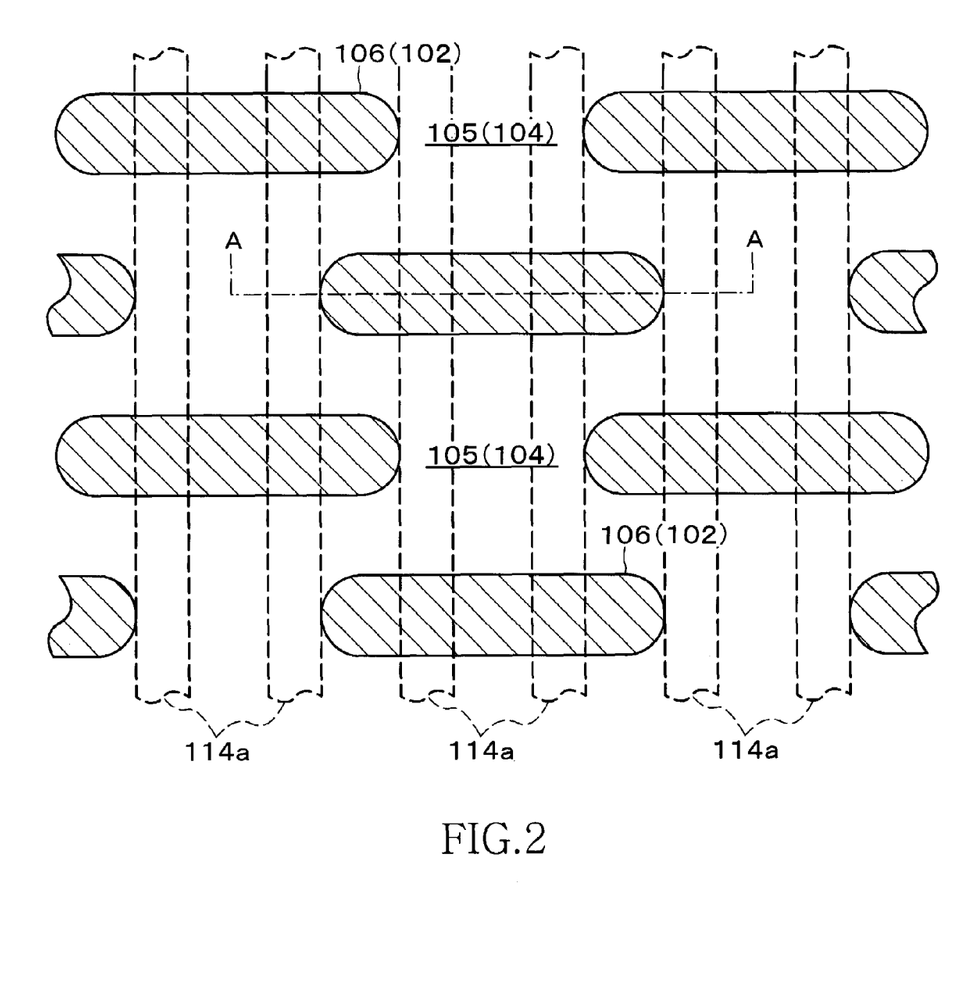
FIG. 2 is a partial top plan view of a pattern shape of the memory cell region M in which the process shown in FIG. 1 is completed.

FIG. 2 is a partial top plan view of a pattern shape of the memory cell region M in which the above process is completed. A cross section along a line A-A in FIG. 2 corresponds to the cross section of the memory region M shown in FIG. 1. As shown in FIG. 2, when the above process is completed, plural active regions 106 encircled by the isolation region 105 are regularly disposed in the memory cell region M. As described above, at this stage, each active region 106 is covered with the silicon nitride film 102 as the field-forming insulation film.

Figure 3:
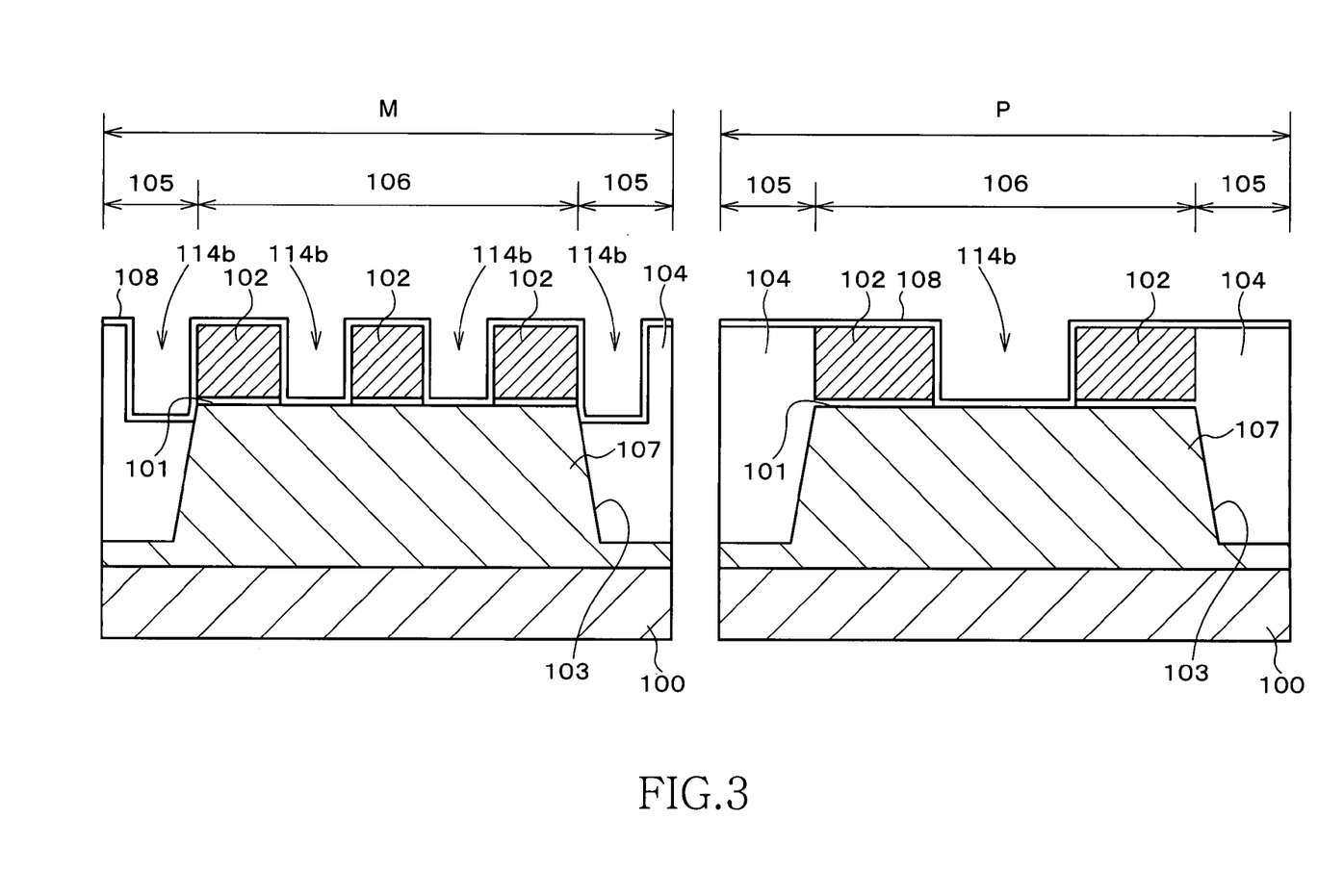
FIG. 3 is a partial cross-sectional diagram showing one process (a formation of a gate trench 114b to a formation of a silicon oxide film 108) of the method of manufacturing a semiconductor device according to a preferred embodiment of the present invention.

Next, the silicon nitride film 102 and the silicon oxide film 104 that are present in a region 114a in which a gate electrode is to be formed are removed using a mask pattern (a gate electrode pattern, not shown). Accordingly, a gate trench 114b as shown in FIG. 3 is formed. Consequently, the surface of the semiconductor substrate 100 (or the silicon oxide film 101) is exposed on the bottom of the gate trench 114b in the active region 106.

Figure 4:
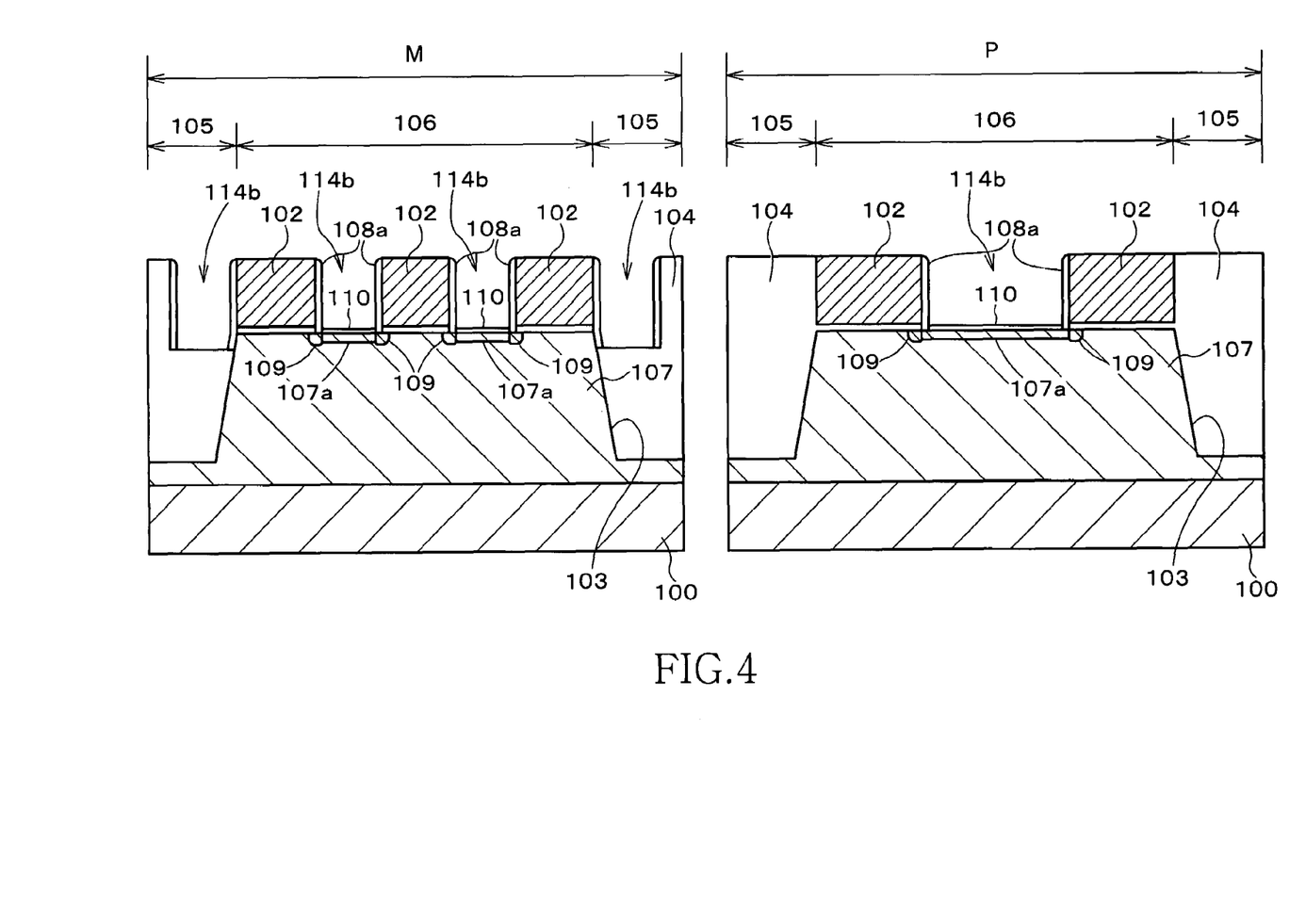
FIG. 4 is a partial cross-sectional diagram showing one process (a formation of a sidewall 108a) of the method of manufacturing a semiconductor device according to a preferred embodiment of the present invention.

Next, a silicon oxide film 108 is formed on the whole surface in a film thickness of about 10 to 20 nm according to low pressure chemical vapor deposition (LPCVD). After this deposition, the silicon oxide film 108 is etched back as shown in FIG. 4. Accordingly, all the silicon oxide film 108 formed on the surface substantially parallel with the surface of the semiconductor substrate 100 is removed, and a sidewall 108a is formed on the side surface of the gate trench 114b. In the active region 106, the surface of the semiconductor substrate 100 is exposed at the bottom of the gate trench 114b. As explained above, according to this embodiment, the inter-gate insulation film (the sidewall 108a) is formed before the formation of the gate electrode. Therefore, defect due to a shortage of a covering rate of the inter-gate insulation film (a shortage between the contacts) can be prevented.

In this state, impurity such as phosphor (P) and arsenic (As) is ion-implanted from a diagonal direction, thereby an LDD region 109 is formed at a lower part of the sidewall 108a. Furthermore, impurity such as boron (B) is ion-implanted from a perpendicular direction if it is necessary to perform channel doping in the channel region 107a. When the formation of the LDD region 109 and the channel doping in the channel region 107a are to be carried out individually in the memory cell region M and the peripheral circuit region P, ion-implantation is carried out in each region with the other region masked. In order to form a circuit in a CMOS structure in the peripheral circuit region P, impurity such as boron (B) is ion-implanted from a diagonal direction into the region in which a P-type MOS transistor is to be formed, thereby the LDD region 109 is formed. According to needs, impurity such as phosphor (P) and arsenic (As) is ion-implanted from a perpendicular direction, thereby carrying out channel doping in the channel region 107a.

Thereafter, a gate insulation film 110 is formed in the thickness of about 6 to 7 nm on the surface of the semiconductor substrate 100 by thermal oxidation.

Figure 5:
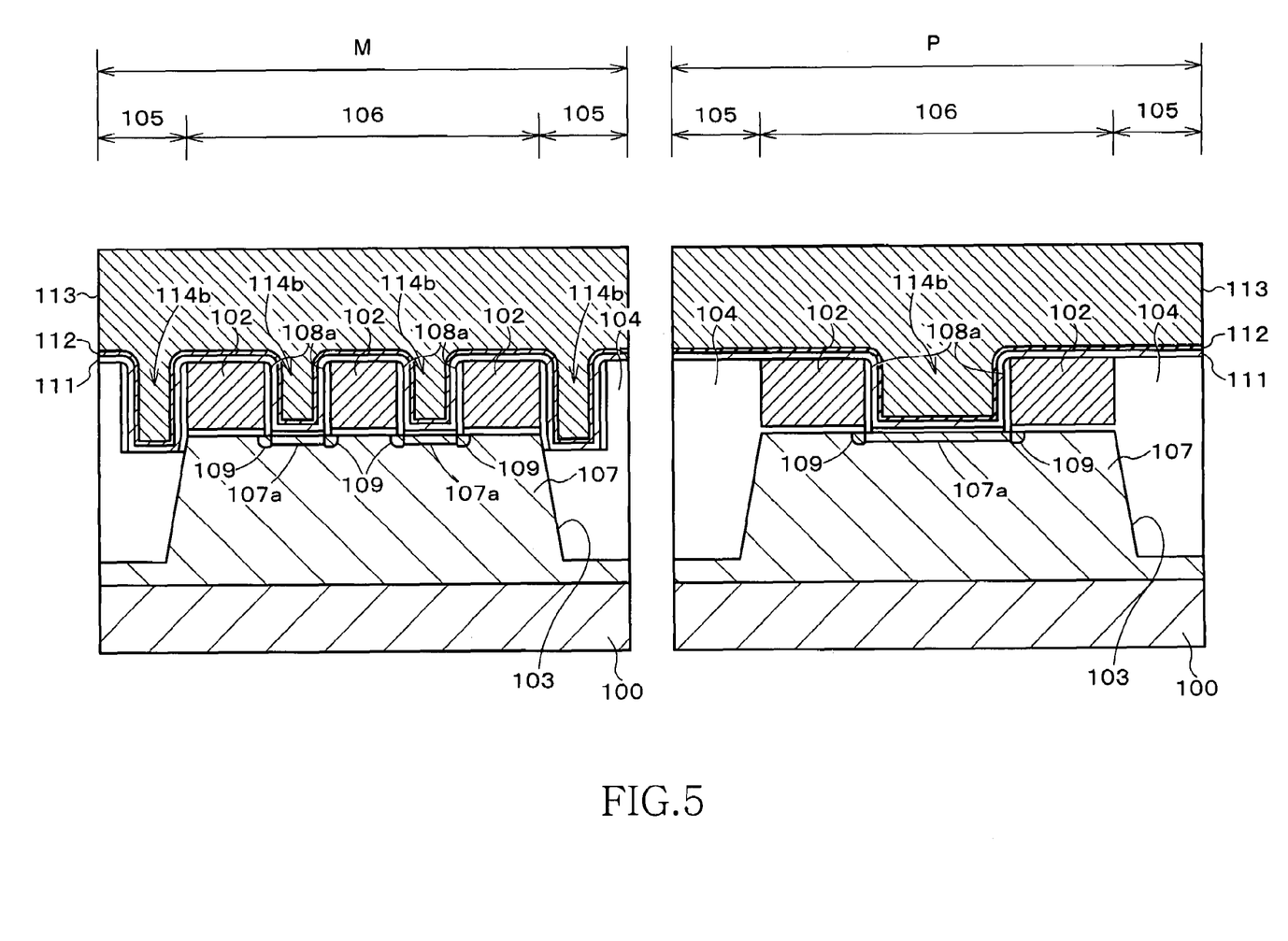
FIG. 5 is a partial cross-sectional diagram showing one process (a formation of a polycrystalline silicon film 111, a tungsten nitride film 112, and a tungsten film 113) of the method of manufacturing a semiconductor device according to a preferred embodiment of the present invention.

Next, as shown in FIG. 5, a polycrystalline silicon film 111 doped with impurity such as phosphor (P), a tungsten nitride (WNx) film 112, and a tungsten (W) film 113 are deposited sequentially. The polycrystalline silicon film 111 can be formed by CVD in a sufficiently small film thickness to avoid the gate trench 114b from being completely filled. For example, when the gate trench 114b has a depth of 200 nm and a width of 100 nm in the memory cell region M, the film thickness of the polycrystalline silicon film 111 can be set to about 20 to 30 nm. The tungsten nitride film 112 and the tungsten film 113 can be formed also by CVD. The tungsten nitride film 112 needs to be set in a sufficiently small film thickness to avoid the gate trench 114b from being completely filled in, like the polycrystalline silicon film 111. Because the tungsten nitride film 112 is used for a barrier layer, a film thickness of 5 to 10 nm is sufficient for the tungsten nitride film 112. On the other hand, the tungsten film 113 needs to have a sufficiently large thickness to completely fill in at least the gate trench 114b.

Figure 6:
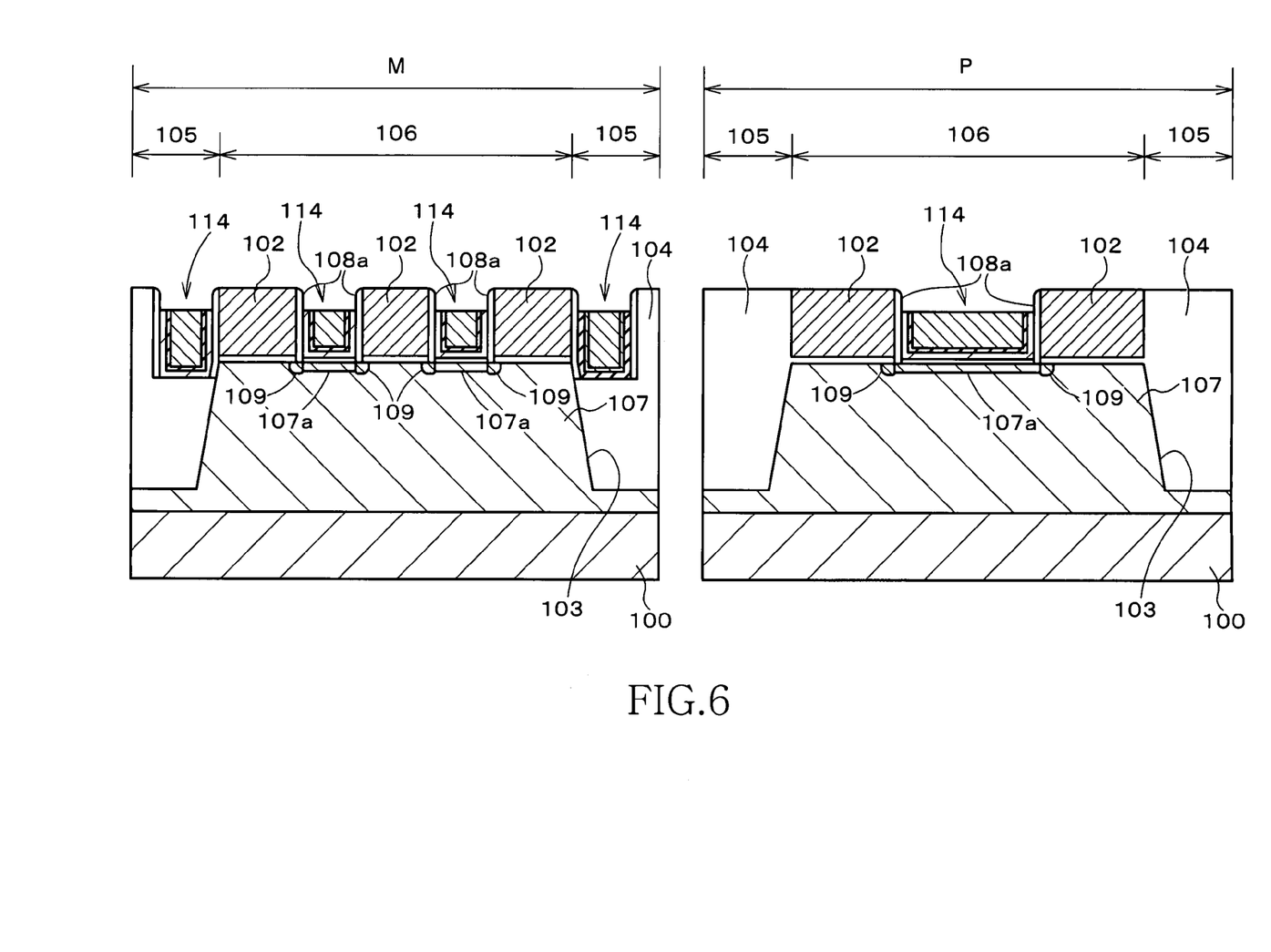
FIG. 6 is a partial cross-sectional diagram showing one process (a formation of a gate electrode 114) of the method of manufacturing a semiconductor device according to a preferred embodiment of the present invention.

Next, as shown in FIG. 6, the tungsten film 113 and the tungsten nitride film 112 are etched back, and the polycrystalline silicon film 111 is etched back. The tungsten film 113 and the polycrystalline silicon film 111 need to be etched back so that the upper surfaces of these films become lower than the upper surface of the silicon nitride film 102 as a field-forming insulation film (i.e., the upper surfaces of the tungsten film 113 and the polycrystalline silicon film 111 should be close to the surface of the semiconductor substrate 100). A step generated as the etch back process is set to be able to absorb a processing (polishing) margin of a cap explained later. For example, when a polishing change is about a maximum 50 nm, the step can be set to 80 nm to 120 nm. Consequently, the gate electrode 114 is buried in the gate trench 114b.

Figure 7:
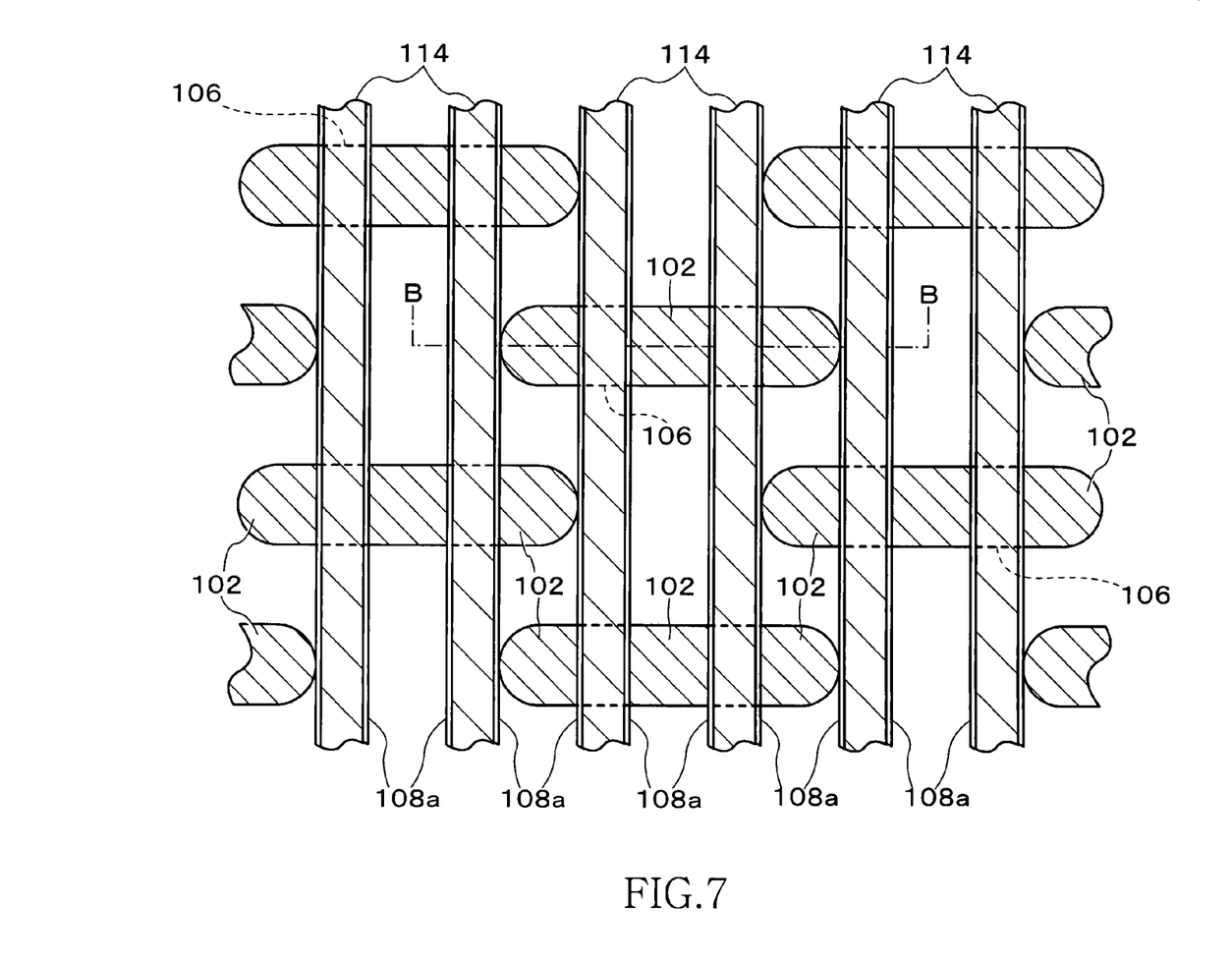
FIG. 7 is a partial top plan view of a pattern shape of the memory cell region M in which the process shown in FIG. 6 is completed.

FIG. 7 is a partial top plan view of a pattern shape of the memory cell region M in which the above process is completed. A cross section along a line B-B in FIG. 7 corresponds to the cross section of the memory region M shown in FIG. 6. As shown in FIG. 7, when the above process is completed, the active region 106 is divided into three portions including a portion covered with the silicon nitride film 102, a portion covered with the gate electrode 114, and a portion covered with the sidewall 108a.

Figure 8:
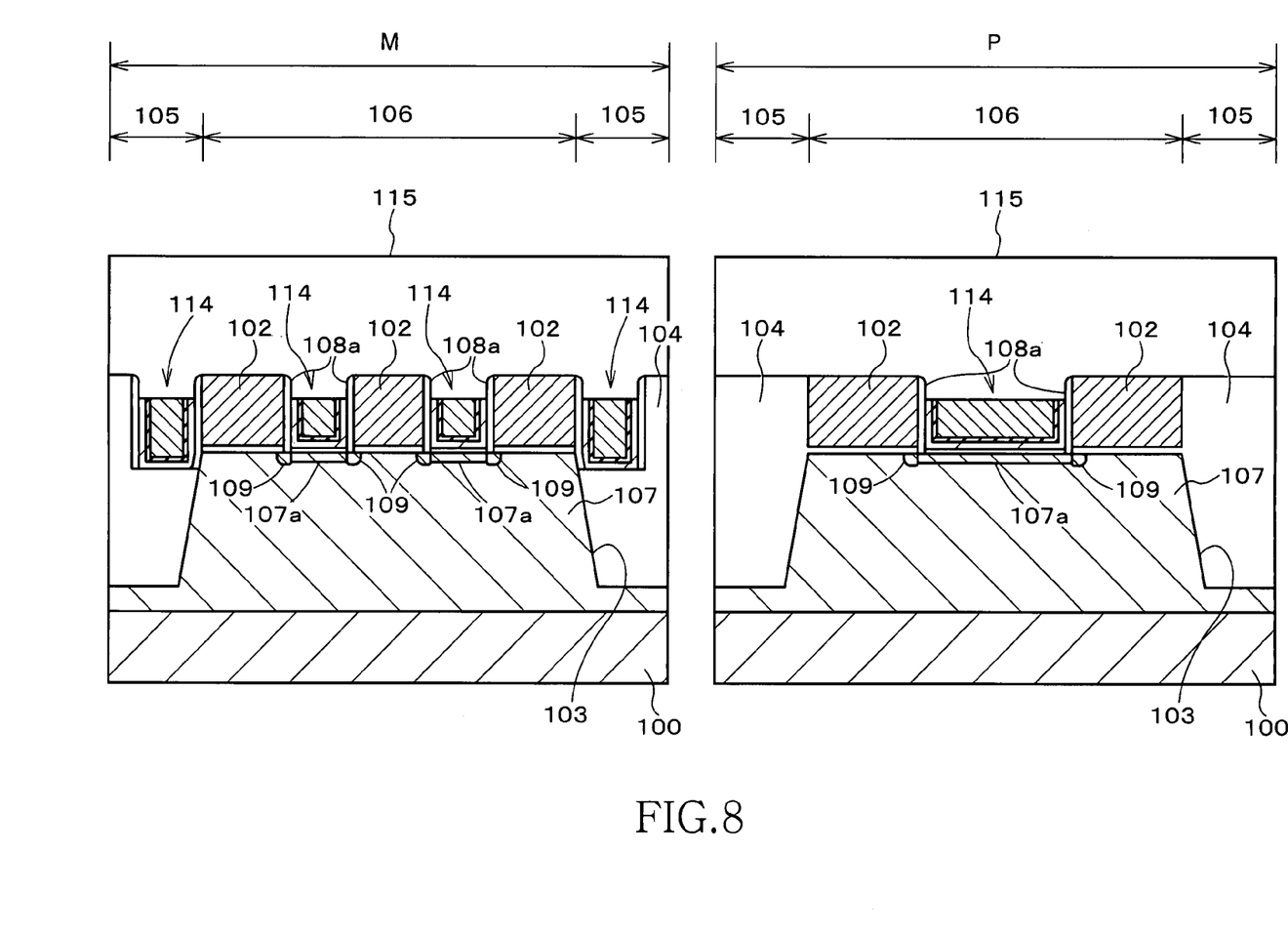
FIG. 8 is a partial cross-sectional diagram showing one process (a formation of a silicon oxide film 115) of the method of manufacturing a semiconductor device according to a preferred embodiment of the present invention.
Figure 9:
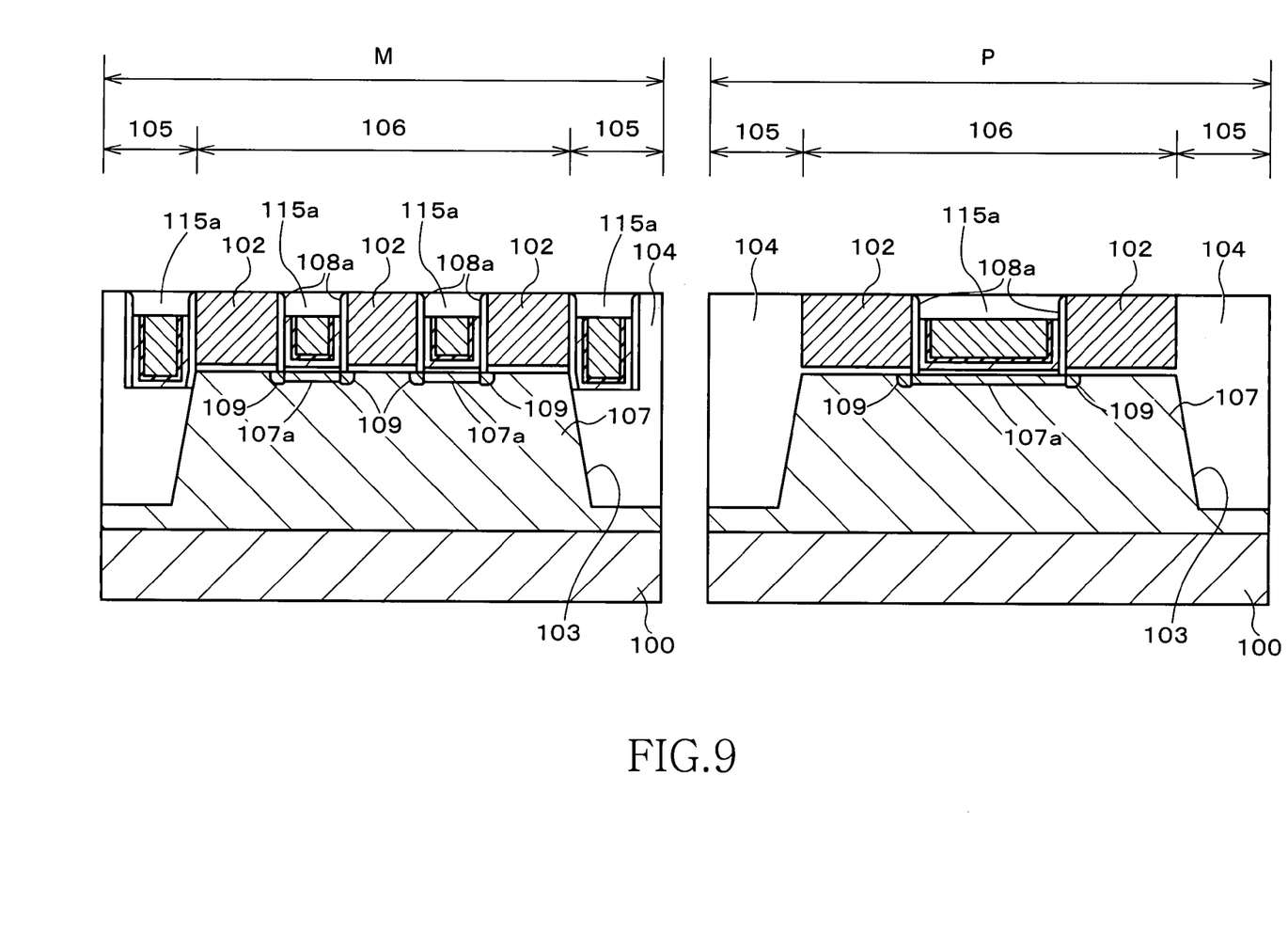
FIG. 9 is a partial cross-sectional diagram showing one process (a formation of a cap 115a) of the method of manufacturing a semiconductor device according to a preferred embodiment of the present invention.

Next, as shown in FIG. 8, a thick silicon oxide film 115 is formed on the whole surface by CVD, and then the silicon oxide film 115 is polished by CMP until when the upper surface of the silicon nitride film 102 is exposed as shown in FIG. 9. Accordingly, the upper surface of the gate electrode 114 is covered with a cap 115a. Side surfaces of the gate electrode 114 are covered with the sidewall 108a as described above. In this embodiment, it is important that both the insulation material that constitutes the sidewall 108a and the insulation material that constitutes the cap 115a are silicon oxide.

Figure 10:
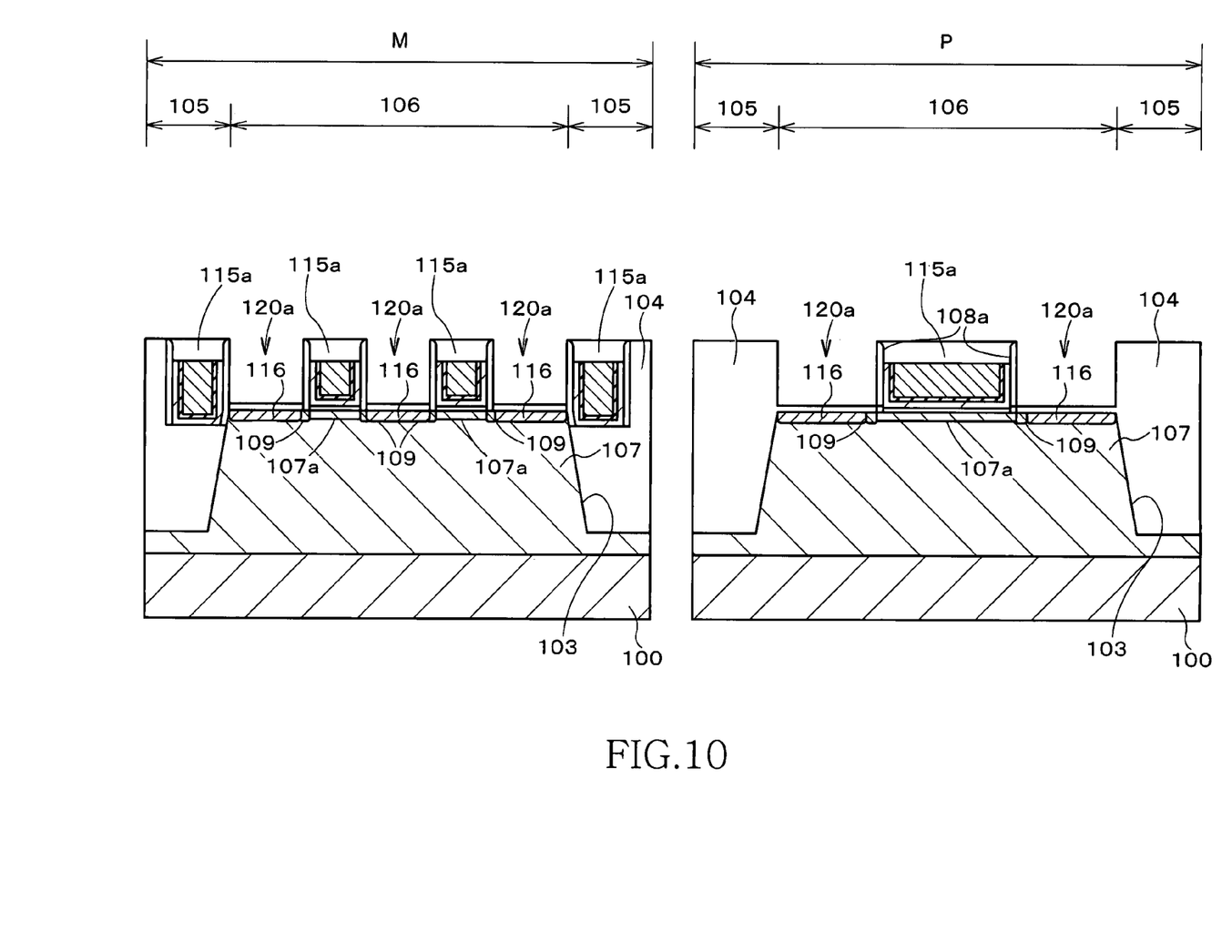
FIG. 10 is a partial cross-sectional diagram showing one process (a formation of a contact hole 120a) of the method of manufacturing a semiconductor device according to a preferred embodiment of the present invention.

Next, as shown in FIG. 10, the silicon nitride film 102 is completely removed by etching, thereby a contact hole 120a is formed. Although this etching method is not particularly limited, at least it is necessary to use a method capable of securing high selectivity of silicon oxide as the material of the sidewall 108a and the cap 115a. This etching method includes a wet etching using a phosphorous ($H_3PO_4$) etchant, for example.

Next, impurity such as phosphor (P) and arsenic (As) is ion-implanted, thereby an N-type source/drain diffusion region 116 is formed. When the source/drain diffusion region 116 is to be formed individually in the memory cell region M and the peripheral circuit region P, ion-implantation is carried out in each region with the other region masked. In order to form a circuit in a CMOS structure in the peripheral circuit region P, impurity such as boron (B) is ion-implanted into the region in which a P-type MOS transistor is to be formed, thereby forming the N-type source/drain diffusion region 116. Accordingly, the N-type source/drain diffusion region 116 can be formed in the active region 106 in self-alignment.

Figure 11:
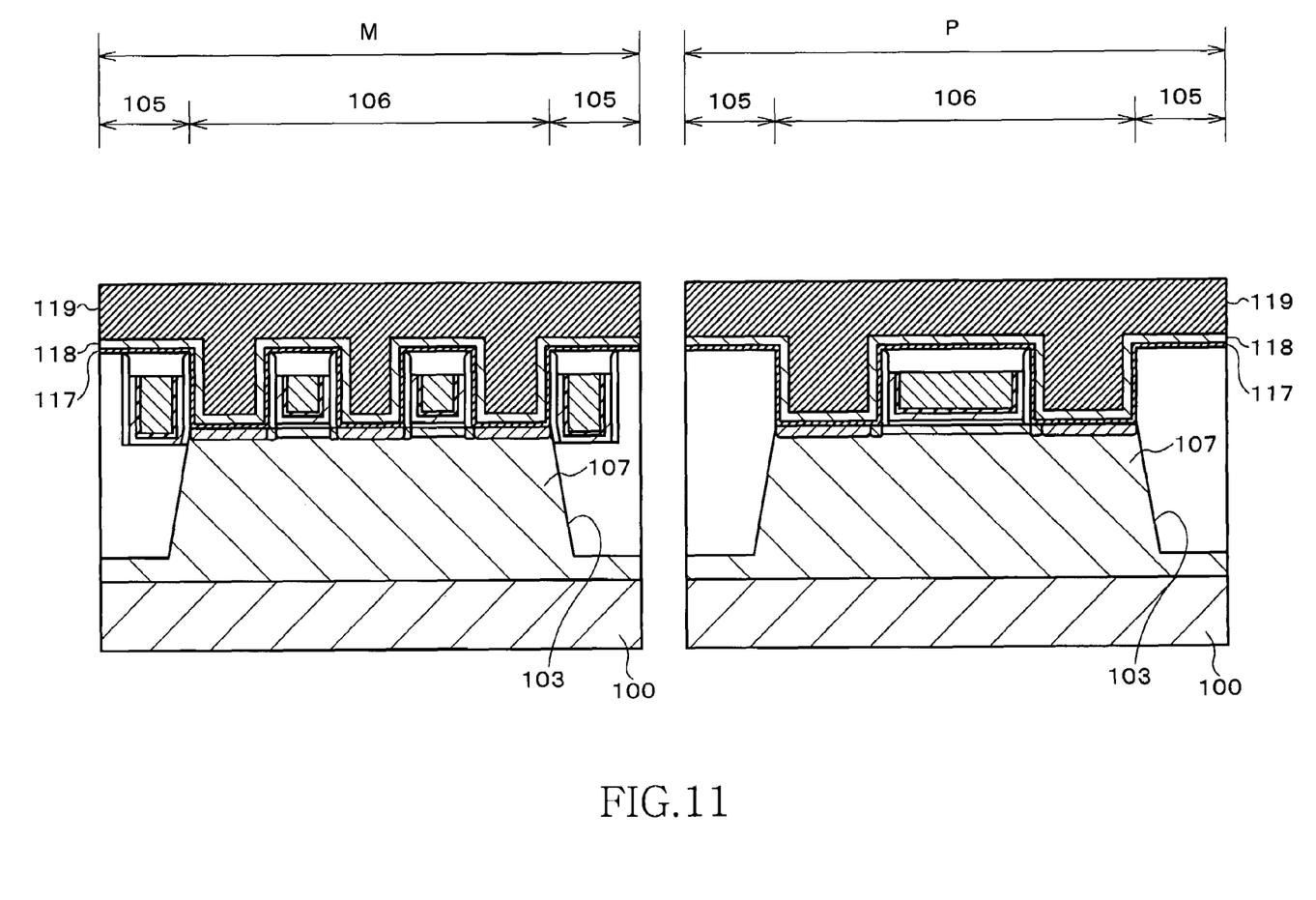
FIG. 11 is a partial cross-sectional diagram showing one process (a formation of a source/drain diffusion region 116 to a formation of a blanket tungsten film 119) of the method of manufacturing a semiconductor device according to a preferred embodiment of the present invention.

Next, as shown in FIG. 11, the silicon oxide film 101 is removed from the N-type source/drain diffusion region 116, and then a titanium (Ti) film 117, a titanium nitride (TiNx) film 118, and a blanket tungsten (W) film 119 are sequentially deposited by CVD. The titanium film 117 is used to form silicide, and the titanium nitride film 118 plays a role of a barrier layer between the titanium film 117 and the blanket tungsten film 119. The titanium film 117 is set to have a film thickness of about 8 to 12 nm, and the titanium nitride film 118 is set to have a film thickness of about 13 to 17 nm. On the other hand, the blanket tungsten film 119 needs to have a sufficiently large film thickness so that at least the contact hole 120a is completely filled in. In this embodiment, the aspect ratio of the contact hole 120a is sufficiently small. Therefore, the above various kinds of conductive materials can be buried without difficulty.

Figure 12:
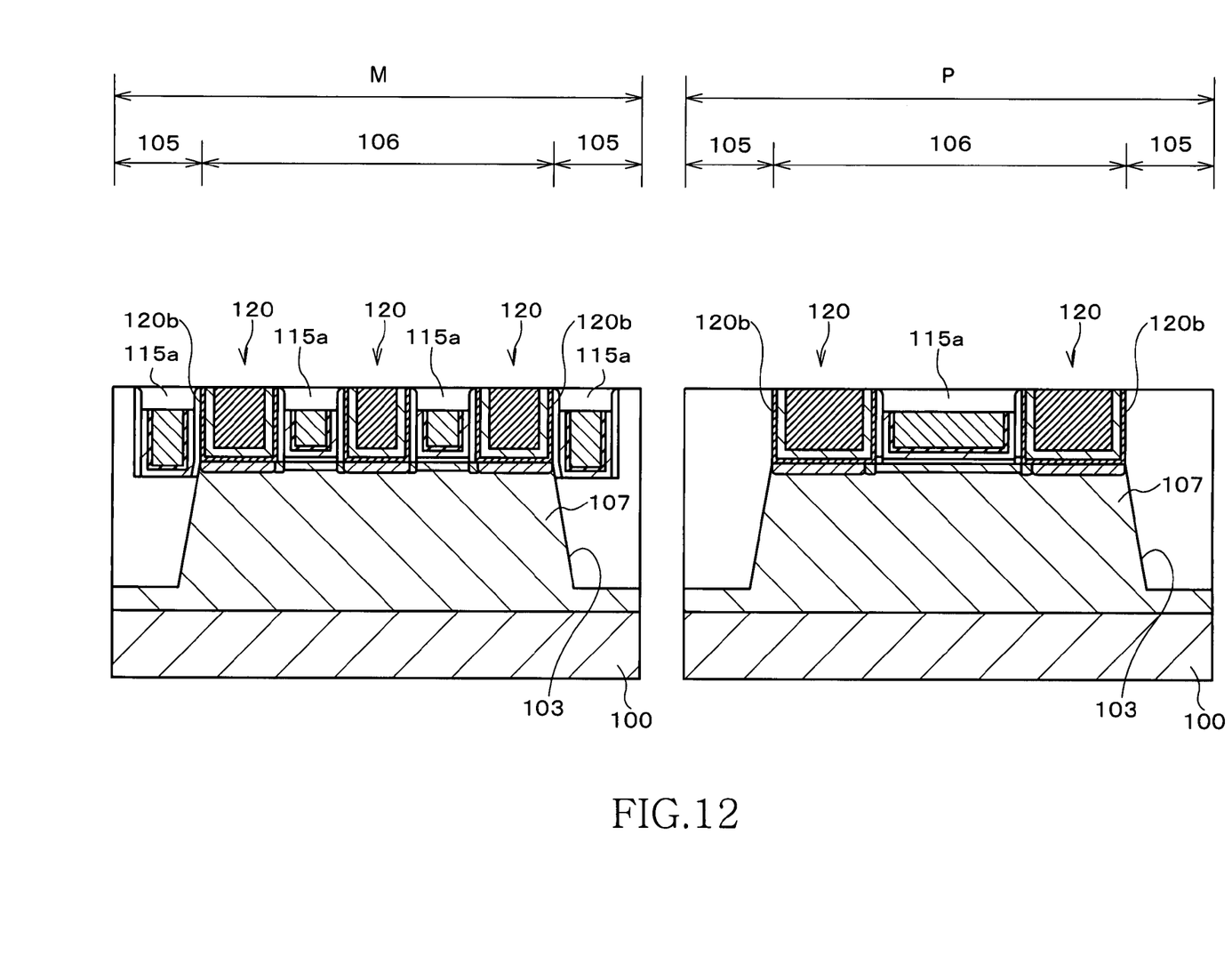
FIG. 12 is a partial cross-sectional diagram showing one process (a formation of a contact plug 120) of the method of manufacturing a semiconductor device according to a preferred embodiment of the present invention.

Next, as shown in FIG. 12, the tungsten film 117, the titanium nitride film 118, and the blanket tungsten film 119 are polished by CMP until when the upper surface of the cap 115a is exposed. Accordingly, the contact plug is buried in the contact hole 120a (contact hole 120a is shown in FIG. 10).

Figure 13:
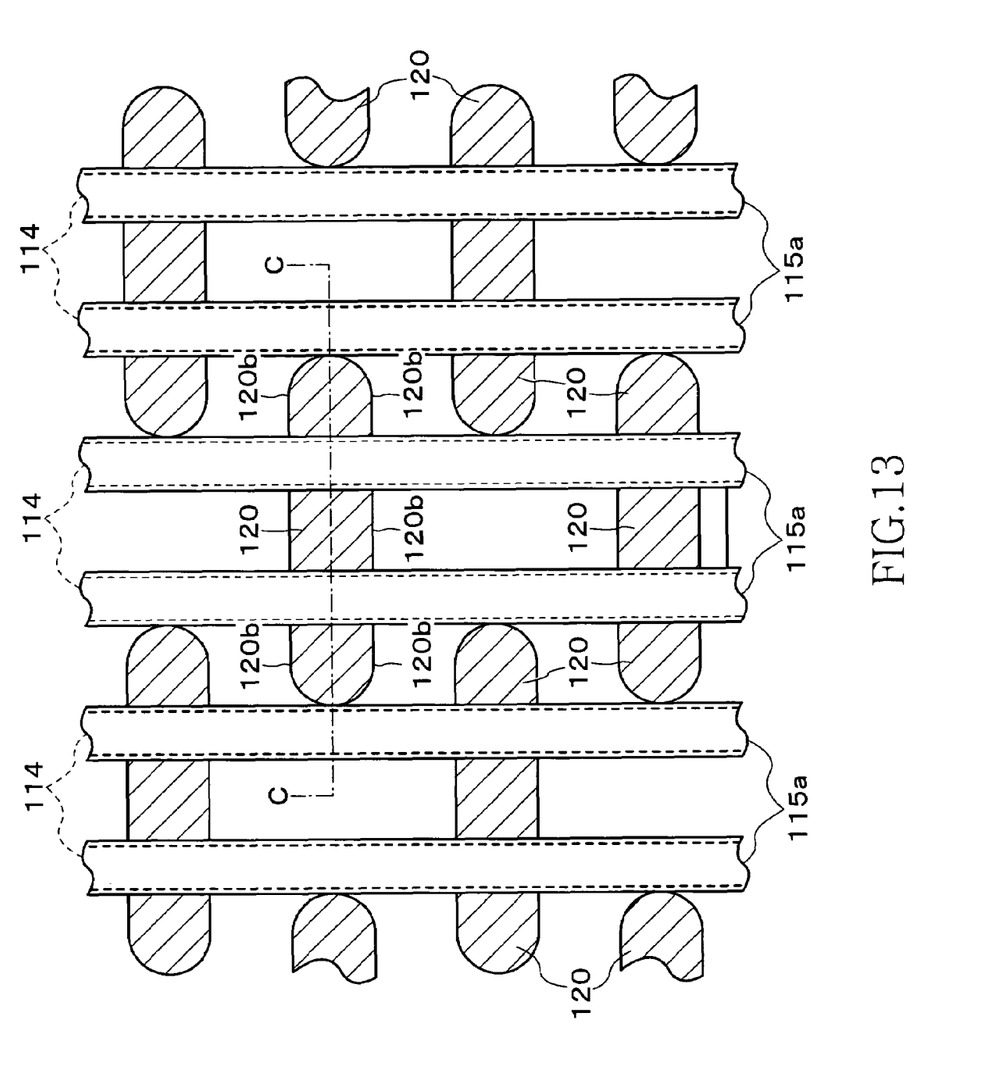
FIG. 13 is a partial top plan view of a pattern shape of the memory cell region M in which the process shown in FIG. 12 is completed.

FIG. 13 is a partial top plan view of a pattern shape of the memory cell region M in which the above process is completed. A cross section along a line C-C in FIG. 13 corresponds to the cross section of the memory region M shown in FIG. 12. As shown in FIG. 13, when the above process is completed, the contact plug 120 is formed in the active region 106 in self-alignment. As shown in FIG. 12 and FIG. 13, a periphery 120b of the contact plug 120 at the isolation region 105 side substantially coincides with a boundary between the isolation region 105 and the active region 106. This means that the active region 106 is substantially covered by only the gate electrode 114, the sidewall 108a, and the contact plug 120. Therefore, in the memory cell region M, a degradation in refresh characteristic owing to a mismatch between masks can be prevented. In the peripheral circuit region P, the active region 106 does not need to be formed slightly wide taking into consideration the margin at forming a contact plug using a mask pattern (a diffusion layer contact pattern) Consequently, the region of the active region 106 can be minimized.

Figure 14:
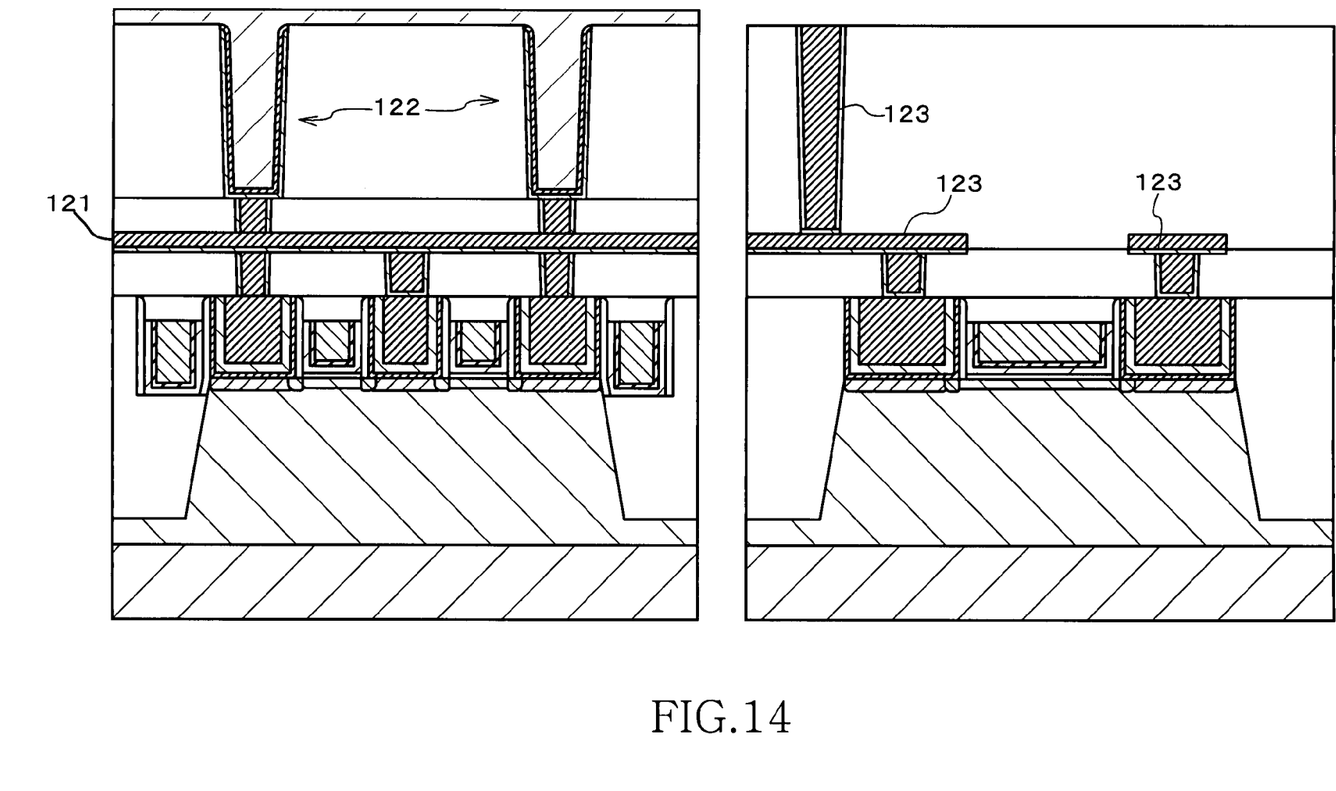
FIG. 14 is a partial cross-sectional diagram of a semiconductor device according to a preferred embodiment of the present invention.

As shown in FIG. 14, a bit line 121 and a memory cell capacitor 122 are formed in the memory cell region M, and various necessary conductive patterns 123 are formed in the peripheral circuit region P, using a general method. Thereafter, further necessary conductive patterns not shown are formed on the memory cell region M and the peripheral circuit region P, thereby completing the semiconductor device according to this embodiment.

As explained above, according to this embodiment, the gate electrode 114 and the contact plug 120 are formed by using the silicon nitride film 102 as a field-forming insulation film. Therefore, the contact plug 120 can be formed in the active region 106 in self-alignment. In other words, the contact plug 120 can be formed without using a mask pattern (a diffusion layer contact pattern) Accordingly, steps of the photolithography process can be reduced. Furthermore, as shown in FIG. 12 and FIG. 13, periphery 120b of the contact plug 120 at the isolation region 105 side substantially coincides with a boundary between the isolation region 105 and the active region 106. Therefore, in the memory cell region M, a degradation in refresh characteristic can be prevented. In the peripheral circuit region P, the area of the active region can be substantially reduced unlike the conventional practice.

According to this embodiment, the aspect ratio of the gate trench 114b and the contact hole 120a can be sufficiently restricted. Therefore, various kinds of materials constituting the gate electrode 114 and various kinds of materials constituting the contact plug 120 can be buried easily.

While preferred embodiment of the present invention has been explained, the invention is not limited by the embodiment. Various modifications can be made without departing from the sprit of the invention, and those modifications are also embraced within the scope of the invention.

While the present invention is applied to a DRAM in the above embodiment, the application of the invention is not limited to this, and can be also applied to other various semiconductor devices such as semiconductor memories, processors, DRAM mounted processors, etc.

While the isolation region 105 has an STI structure in the above embodiment, the element isolation region 105 can be formed by local oxidation of silicon (LOCOS). However, when the element isolation region 105 has an STI structure like in this embodiment, the silicon oxide film 104 on the isolation region 105 can be made substantially flat. Therefore, processing such as the formation of the gate trench can be carried out more easily.

While the gate electrode 114 has a multilayer structure constituted of the polycrystalline silicon film 111, the tungsten nitride film 112, and the tungsten film 113 in the above embodiment, a structure and materials of the gate electrode are not particularly limited. Therefore, the gate electrode can be in a single layer structure made of only a polycrystalline silicon film, for example. Similarly, while the contact plug 120 has a multilayer structure constituted of the titanium film 117, the titanium nitride film 118, and the blanket tungsten film 119 in the above embodiment, a structure and materials of the contact plug are not particularly limited.

As explained above, according to the present invention, a diffusion contact pattern is not necessary. Consequently, steps of the photolithography process can be reduced, and the semiconductor device can be highly integrated by reducing the area of the active region. Because the aspect ratio of a gate trench and a contact hole can be restricted, various kinds of materials constituting a gate electrode and various kinds of materials constituting a contact plug can be buried easily.

Therefore, the present invention can be applied particularly effectively to a semiconductor device that requires a high integration of a DRAM and strongly requires a cost reduction.

What is claimed is:

1. A semiconductor device, comprising:
   an active region that is surrounded by an isolation region having a source/drain diffusion region and a channel region;
   a gate electrode provided on the channel region; and
   a contact plug connected to the source/drain diffusion region, wherein
   a periphery of the contact plug at the isolation region side substantially coincides with a boundary between the isolation region and the active region.

2. The semiconductor device as claimed in claim 1, further comprising a sidewall that covers a side surface of the gate electrode and a cap that covers an upper surface of the gate electrode, the sidewall and the cap being made of the same dielectric material as each other.

3. The semiconductor device as claimed in claim 2, wherein said dielectric material is silicon oxide.

4. The semiconductor device as claimed in claim 2, wherein an upper surface of the contact plug and an upper surface of the cap are coplanar.

5. The semiconductor device as claimed in claim 1, wherein said isolation region has a structure that a dielectric material is buried in an isolation trench.

6. A semiconductor device comprising at least a memory cell region and a peripheral circuit region, wherein
   each of the memory cell region and the peripheral circuit region includes:
   an active region that is surrounded by an isolation region having a source/drain diffusion region and a channel region;
   a gate electrode provided on the channel region; and
   a contact plug connected to the source/drain diffusion region, wherein
   a periphery of the contact plug at the isolation region side substantially coincides with a boundary between the isolation region and the active region.

* * * * *